(12) United States Patent
Kim et al.

(10) Patent No.: US 9,966,376 B2
(45) Date of Patent: May 8, 2018

(54) SEMICONDUCTOR DEVICES AND INVERTER HAVING THE SAME

(71) Applicant: SAMSUNG ELECTRONICS CO., LTD., Suwon-si, Gyeonggi-do (KR)

(72) Inventors: Mun-Hyeon Kim, Seoul (KR);
Chang-Woo Noh, Hwaseong-si (KR);
Keun-Hwi Cho, Seoul (KR);
Myung-Gil Kang, Suwon-si (KR);
Shigenobu Maeda, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/231,134

(22) Filed: Aug. 8, 2016

(65) Prior Publication Data

US 2017/0103986 A1 Apr. 13, 2017

(30) Foreign Application Priority Data

Oct. 8, 2015 (KR) .................. 10-2015-0141584

(51) Int. Cl.
*H01L 27/092* (2006.01)
*H01L 29/49* (2006.01)
(Continued)

(52) U.S. Cl.
CPC ........ *H01L 27/0924* (2013.01); *H01L 27/092*
(2013.01); *H01L 21/823821* (2013.01); *H01L 21/823828* (2013.01); *H01L 21/823842* (2013.01); *H01L 21/823871* (2013.01); *H01L 21/823878* (2013.01); *H01L 27/0207* (2013.01); *H01L 29/49* (2013.01); *H01L 29/51* (2013.01)

(58) Field of Classification Search
CPC ...... H01L 27/0924; H01L 29/49; H01L 29/51
See application file for complete search history.

(56) References Cited

U.S. PATENT DOCUMENTS 7,858,484 B2 12/2010 Mizumura
7,883,983 B2 2/2011 Hase
(Continued)

FOREIGN PATENT DOCUMENTS

| JP | 2014-207295 | 10/2014 |
|---|---|---|
| KR | 1020010093013 | 10/2001 |
| KR | 1020150071637 | 6/2015 |

*Primary Examiner* — Su C Kim
*Assistant Examiner* — David S Wilbert
(74) *Attorney, Agent, or Firm* — F. Chau & Associates, LLC

(57) ABSTRACT

Disclosed are CMOS device and CMOS inverter. The CMOS device includes a substrate having active lines extending in a first direction and defined by a device isolation layer, the substrate being divided into an NMOS area, a PMOS area and a boundary area interposed between the NMOS and the PMOS areas and having the device isolation layer without the active line, a gate line extending in a second direction across the active lines and having a first gate structure on the active line in the first area, a second gate structure on the active line in the second and a third gate structure on the device isolation layer in the third area. The electrical resistance and parasitic capacitance of the third gate structure are smaller than those of the NMOS and the PMOS gate structures. Accordingly, better AC and DC performance of the CMOS device can be obtained.

16 Claims, 11 Drawing Sheets

(51) Int. Cl.
  *H01L 29/51* (2006.01)
  *H01L 21/8238* (2006.01)
  *H01L 27/02* (2006.01)

(56) References Cited

U.S. PATENT DOCUMENTS

| | | |
|---|---|---|
| 8,450,163 B2 | 5/2013 | Beyer et al. |
| 8,981,489 B2 | 3/2015 | Xiong et al. |
| 2013/0334613 A1* | 12/2013 | Moroz ............... G06F 17/5072 257/401 |
| 2013/0341731 A1 | 12/2013 | Chen et al. |
| 2015/0171177 A1 | 6/2015 | Cheng et al. |

* cited by examiner

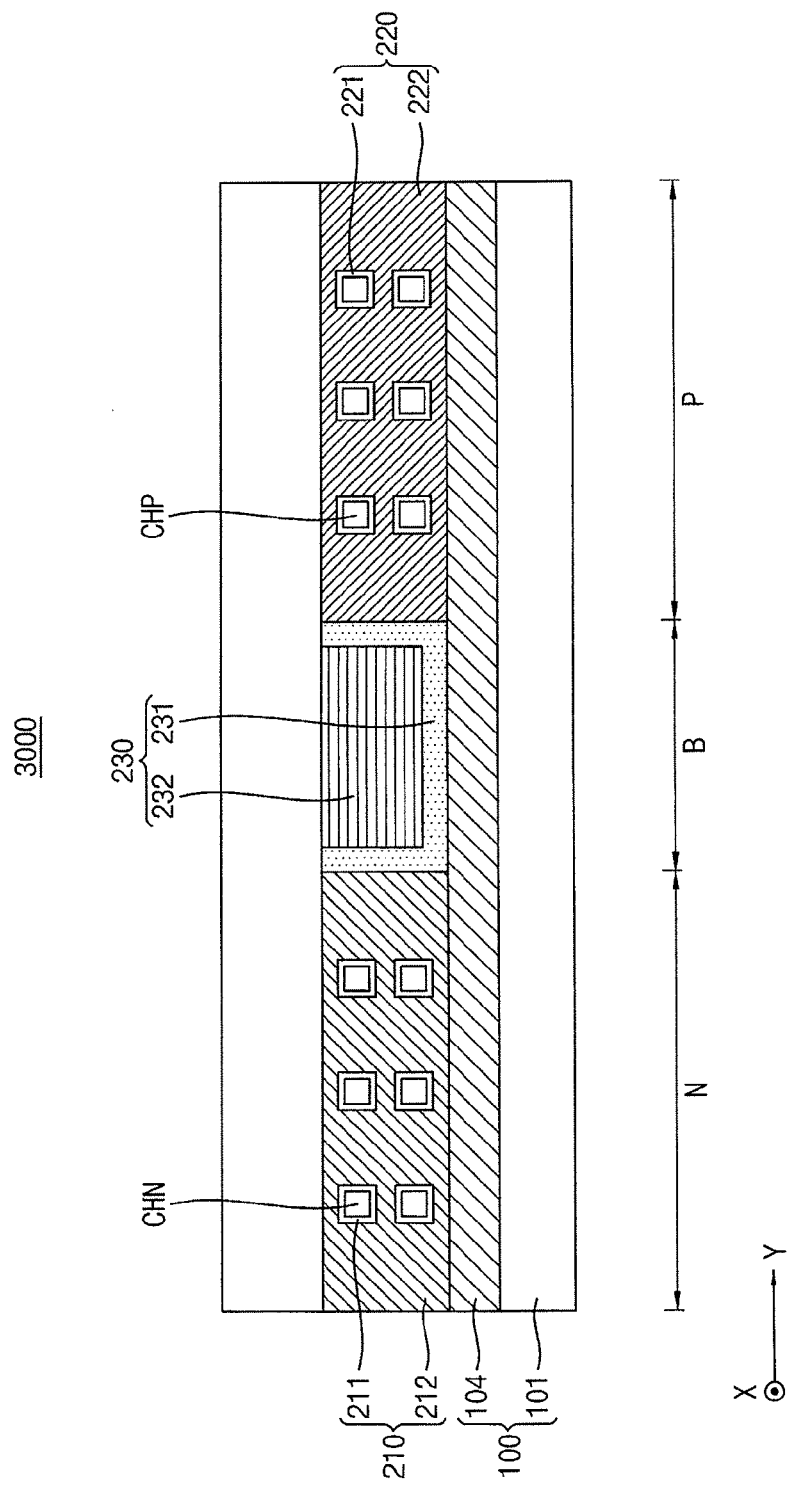

SEMICONDUCTOR DEVICES AND INVERTER HAVING THE SAME

CROSS-REFERENCE TO RELATED APPLICATIONS

This application claims priority under 35 U.S.C § 119 to Korean Patent Application No. 10-2015-0141584 filed on Oct. 8, 2015 in the Korean Intellectual Property Office, the contents of which are incorporated by reference herein in their entirety.

TECHNICAL FIELD

The present invention generally relates to a semiconductor device and an inverter having the same, and more particularly, to a complementary metal oxide semiconductor (CMOS) device having a p-type MOS (PMOS) device and an n-type MOS (NMOS) device, and a CMOS inverter having the CMOS.

DISCUSSION OF RELATED ART

As the recent memory devices being highly integrated and miniaturized, the size of the active regions in the semiconductor substrate may be reduced. The reduction of the gate width and the channel length in the cell transistors may cause the gate resistance and the threshold voltage to increase. Particularly, the decrease of the channel length in the metal oxide semiconductor field effect transistor (MOSFET) may cause a deterioration of the gate channel characteristics, which is a phenomenon known as a short channel effect.

Industry efforts on reducing the size of semiconductor devices have brought about various technologies for addressing the short channel effect and current leakage. For example, it has been suggested to provide a fin structure in which the semiconductor material protrudes into a fin shape with the gate electrode wrapping around the fin to expand the channel, to provide a gate-all-around (GAA) structure in which the channel is enclosed by the gate electrode, to provide a multichannel structure in which a single gate electrode contacts a plurality of the channels, or to provide various vertical transistors including one of the above fin structures, GAA structures, and multichannel structures. Moreover, a nano wire channel transistor has been suggested for having high performance with low power. In a nano wire channel transistor, the channel of the GAA structure is replaced with a nano wire channel.

Reducing the size of the memory devices may also cause an increase of parasitic capacitance and electrical resistance in addition to the short channel effect and the current leakage described above. Particularly, when the line width of the gate electrode decreases to a few tens of nanometers and causes the occupied area of the gate electrode to ultimately decrease, the parasitic capacitance of the CMOS device then ultimately increases at a boundary area between the PMOS and the NMOS, thereby significantly decreasing an alternative current (AC) performance of CMOS device. Thus, in the process of miniaturization of the memory device, the vertical transistor generally requires having its parasitic capacitance and electrical resistance significantly reduced to have a stable device operation.

SUMMARY

Example embodiments of the present inventive concept provide a semiconductor device having low parasitic capacitance at the boundary area between a PMOS area and an NMOS area, and provide an inverter having the above semiconductor device.

According to an exemplary embodiment of the present inventive concept, there is provided a semiconductor device including: a substrate having a first conductivity type and a plurality of active lines that extend in a first direction and are defined by a device isolation layer, the substrate being divided into a first area in which a well having a second conductivity type may be arranged, a second area in which the well may not be arranged and a third area interposed between the first and the second areas and having the device isolation layer without any active line; a gate line extending in a second direction across the plurality of active lines and having a first gate structure on a first active line from among the plurality of active lines in the first area of the substrate, a second gate structure on a second active line from among the plurality of active lines in the second area of the substrate and a third gate structure on the device isolation layer in the third area of the substrate, composition of the third gate structure being different from those of the first and the second gate structures; a first junction layer arranged on the first active line close to the first gate structure and having the first conductivity type; and a second junction layer arranged on the second active line close to the second gate structure and having the second conductivity type.

In an example embodiment of the present inventive concept, the first gate structure may include a first dielectric layer and a first metal gate that may be arranged on the first dielectric layer and may have a first work function for a first conductivity type metal oxide semiconductor (MOS) device, and the second gate structure may include a second dielectric layer and a second metal gate that may be arranged on the second dielectric layer and may have a second work function for a second conductivity type metal oxide semiconductor (MOS) device. The third gate structure may include a third dielectric layer having a dielectric constant smaller than those of the first and the second dielectric layers and a third metal gate that may be arranged on the third dielectric layer.

In an example embodiment of the present inventive concept, the first and the second dielectric layers may have a dielectric constant in a range of about 10 to about 25 and the third dielectric layer may have a dielectric constant in a range of about 1 to about 5.

In an example embodiment of the present inventive concept, the first and the second dielectric layers may include at least one material selected from the group consisting of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), plumbum scandium tantalum oxide (PbScTaO) and combinations thereof, and the third dielectric layer may include at least one of silicon oxide and porous nano fiber.

In an example embodiment of the present inventive concept, the first and the second metal gate may include multilayer in which at least a metal layer and at least a metal nitride layer may be stacked, and the third metal gate may include a single metal layer.

In an example embodiment of the present inventive concept, the first metal gate may include at least one material selected from the group consisting of hafnium (Hf), zirconium (Zr), titanium (Ti), tantalum (Ta), aluminum (Al), alloys thereof and carbides thereof, and the third metal gate may include at least one material selected from the group consisting of tungsten (W), titanium (Ti), tantalum (Ta), aluminum (Al), copper (Cu) and combinations thereof.

In an example embodiment of the present inventive concept, the second metal gate may include at least one material selected from the group consisting of ruthenium (Ru), palladium (Pd), platinum (Pt), titanium (Yi), tantalum (Ta), aluminum (Al) and nitrides thereof, and the third metal gate may include at least one material selected from the group consisting of tungsten (W), titanium (Ti), tantalum (Ta), aluminum (Al), copper (Cu) and combinations thereof.

In an example embodiment of the present inventive concept, the first metal gate may include a 4-stack structure in which a titanium aluminum (TiAl) layer, a titanium nitride (TiN) layer, a titanium (Ti) layer and an aluminum (Al) layer may be sequentially stacked, and the second metal gate may include a 4-stack structure in which a titanium nitride (Ti) layer, a tantalum nitride (TaN) layer, a titanium nitride (TiN) layer and an aluminum (Al) layer may be sequentially stacked. The third metal gate may include a tungsten (W) layer.

In an example embodiment of the present inventive concept, the gate line may include a first interface layer interposed between the first dielectric layer and the first active line in the first area of the substrate, and a second interface layer interposed between the second dielectric layer and the second active line in the second area of the substrate.

In an example embodiment of the present inventive concept, the first gate structure may include a first dielectric layer and a first metal gate that may be arranged on the first dielectric layer and may have a first work function for a first conductivity type metal oxide semiconductor (MOS) device, and the second gate structure may include a second dielectric layer and a second metal gate that may be arranged on the second dielectric layer and may have a second work function for a second conductivity type metal oxide semiconductor (MOS) device. The third gate structure may include a barrier metal layer and a single metal layer on the barrier metal layer.

In an example embodiment of the present inventive concept, the single metal layer may include a conductive metal, and the barrier metal layer may include a nitride of the conductive metal.

In an example embodiment of the present inventive concept, the first conductivity type may include an n-type in which a donor (electron) may be provided as a carrier and the second conductivity type may include a p-type in which an acceptor (hole) may be provided as a carrier such that an n-type field effect transistor (NFET) may be arranged in the first area N of the substrate and a p-type field effect transistor (PFET) may be arranged in the second area P of the substrate.

In an example embodiment of the present inventive concept, each of the plurality of active lines may protrude from the device isolation layer like a fin, thereby providing an active fin line extending in the first direction on the substrate.

In an example embodiment of the present inventive concept, the semiconductor device may further include semiconductor patterns on the active fin line at both sides of the gate line in the first and the second areas of the substrate such that the first and the second junction layers may be arranged on the semiconductor patterns in the first and the second areas of the substrate, respectively.

In an example embodiment of the present inventive concept, the semiconductor pattern may include an epitaxial pattern which may include silicon germanium.

In an example embodiment of the present inventive concept, the substrate may include a channel trench shaped into a line extending in the second direction such that the gate line may be buried into the channel trench and the first and the second junction layers may be arranged on an active region neighboring the channel trench.

In an example embodiment of the present inventive concept, the semiconductor device may further include a first channel structure crossing the channel trench to contact with the first junction layer and enclosed by the first gate structure in the first area of the substrate, and a second channel structure crossing the channel trench to contact with the second junction layer and enclosed by the second gate structure in the second area of the substrate.

In an example embodiment of the present inventive concept, the channel structure may include at least a nano wire channel.

According to an exemplary embodiment of the present inventive concept, there is provided a CMOS inverter including: a substrate having a plurality of active lines that may extend in a first direction and may be defined by a device isolation layer, the substrate being divided into an NMOS area, a PMOS area and a boundary area interposed between the NMOS area and the PMOS area and having the device isolation layer without any active line; a gate line extending in a second direction across the plurality of active lines and having an NMOS gate structure on a first active line from among the plurality of active lines in the NMOS area of the substrate, a PMOS gate structure on a second active line from among the plurality of active lines in the PMOS area of the substrate, and a boundary gate structure on the device isolation layer in the boundary area of the substrate, a dielectric constant of the boundary gate structure being smaller than those of the NMOS and PMOS gate structures; a plurality of NMOS transistors arranged in the first direction, each of the plurality of NMOS transistors including the NMOS gate structure and an n-type junction layer on the first active line close to the NMOS gate structure; a plurality of PMOS transistors arranged in the first direction, each of the plurality of PMOS transistors including the PMOS gate structure and a p-type junction layer on the second active line close to the PMOS gate structure; an input line connected to the boundary gate structure and transferring an input signal; and an output line connected with the n-type junction layer and the p-type junction layer in series, and selectively transferring an output signal from one of the NMOS transistor and the PMOS transistor in complementary to each other in response to the input signal.

In an example embodiment of the present inventive concept, the NMOS gate structure may include a first dielectric layer and a first metal gate that may be arranged on the first dielectric layer and may have a first work function for an NMOS device, and the PMOS gate structure may include a second dielectric layer and a second metal gate that may be arranged on the second dielectric layer and may have a second work function for a PMOS device. The third gate structure may include a third dielectric layer having a dielectric constant smaller than those of the first and the second dielectric layers, and a third metal gate that may be arranged on the third dielectric layer.

In an example embodiment of the present inventive concept, each of the first and the second dielectric layers may have a dielectric constant in a range of about 10 to about 25, and the third dielectric layer may have a dielectric constant in a range of about 1 to about 5.

In an example embodiment of the present inventive concept, the first and the second dielectric layers may include at least one material selected from the group consisting of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), plumbum scandium tantalum oxide (PbScTaO) and combinations thereof, and the third dielectric layer may include at least one of silicon oxide and porous nano fiber.

In an example embodiment of the present inventive concept, the third metal gate may include at least one material selected from the group consisting of tungsten (W), titanium (Ti), tantalum (Ta), aluminum (Al), copper (Cu) and combinations thereof.

According to an example embodiment of the present inventive concept, a single gate line may extend on a substrate in a line across an NMOS area, a PMOS area and a boundary area interposed between the NMOS and the PMOS areas. An NMOS gate structure may be provided with the gate line in the NMOS area of the substrate and a PMOS gate structure may be provided with the gate line in the PMOS area of the substrate. A boundary gate structure may be provided with the gate line in the boundary area of the substrate in such a way that the boundary gate structure may be electrically connected with both of the NMOS and PMOS gate structures. In such a case, the dielectric constant and the electrical resistance of the boundary gate structure may be sufficiently smaller than those of the NMOS and the PMOS gate structures, thereby reducing the parasitic capacitance and an overall electrical resistance of the gate line.

According to an exemplary embodiments of the present inventive concept, there is provided a semiconductor device including: a substrate having a first conductivity type and a plurality of active fin lines that extend in a first direction and protrude from a device isolation layer, the substrate being divided into a first area in which a well having a second conductivity type may be arranged, a second area in which the well may not be arranged, and a third area interposed between the first and the second areas and having the device isolation layer without any active fin line; a gate line extending in a second direction across the plurality of active fin lines and having a first gate structure on a first active fin line from among the plurality of active fin lines in the first area of the substrate, a second gate structure on a second active fin line from among the plurality of active fin lines in the second area of the substrate, and a third gate structure on the device isolation layer in the third area of the substrate; a first junction layer arranged on the first active fin line at both sides of the first gate structure and having the first conductivity type; and a second junction layer arranged on the second active fin line at both sides of the second gate structure and having the second conductivity type, in which the first gate structure may include a first dielectric layer and a first metal gate that is arranged on the first dielectric layer and has a first work function for a first conductivity type metal oxide semiconductor (MOS) device, the second gate structure may include a second dielectric layer and a second metal gate that is arranged on the second dielectric layer and has a second work function for a second conductivity type metal oxide semiconductor (MOS) device, and the third gate structure may include a third dielectric layer having a dielectric constant smaller than those of the first and the second dielectric layers and a third metal gate that is arranged on the third dielectric layer.

In an example embodiment of the present inventive concept, the third metal gate may have an electrical resistance lower than those of the first and second metal gates, and may include at least one material selected from the group consisting of tungsten (W), titanium (Ti), tantalum (Ta), aluminum (Al), copper (Cu) and combinations thereof.

In addition, in case of the CMOS inverter including the semiconductor devices, the contact resistance between the boundary gate structure and the contact plug may also be reduced, thereby improving the operation performance of the CMOS inverter. Particularly, the parasitic capacitance reduction of the gate line between the NMOS area and the PMOS area may sufficiently increase the AC performance of the CMOS inverter.

BRIEF DESCRIPTION OF THE DRAWINGS

The above and other features of the present inventive concept will become more apparent by describing in detail exemplary embodiments thereof with reference to the accompanying drawings, and in which:

FIG. 5 is a cross-sectional view illustrating a semiconductor device different from those of FIGS. 1 and 3 in accordance with an example embodiment of the present inventive concept;

Figure 1:
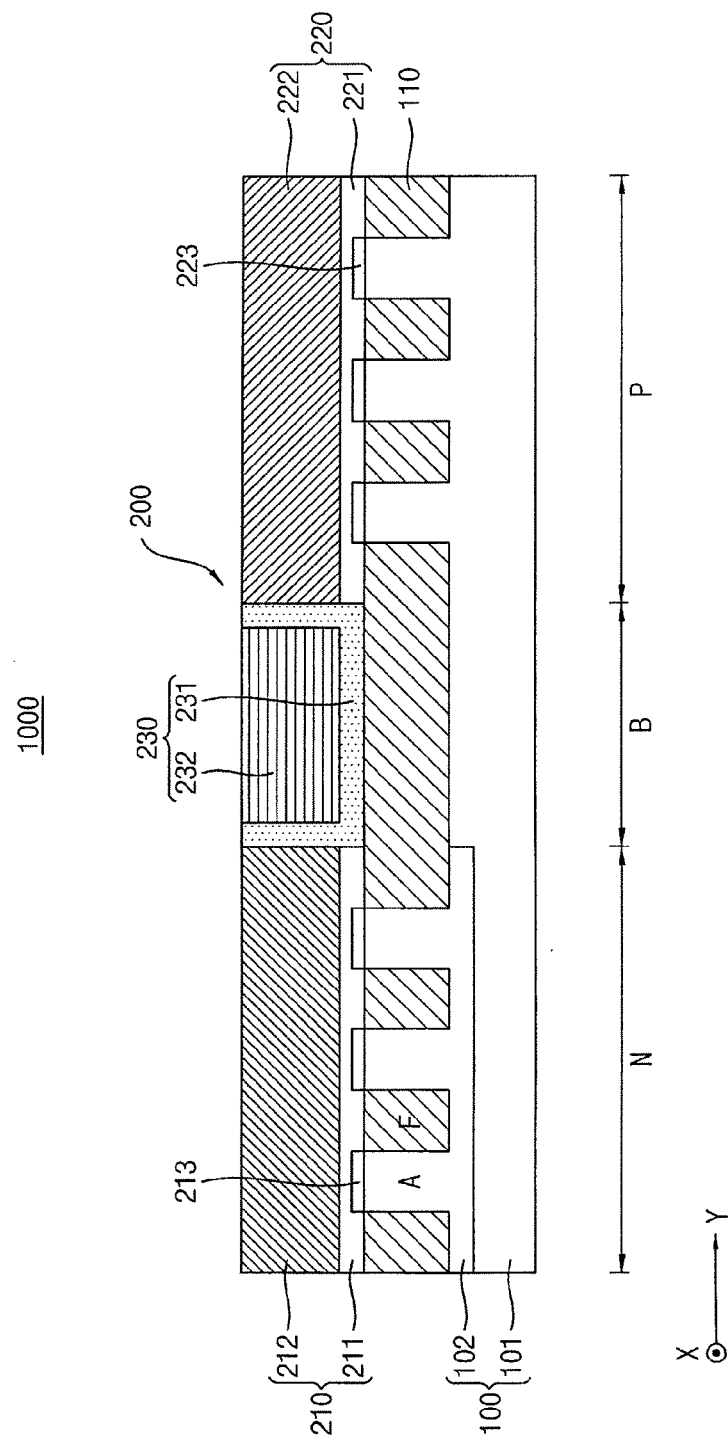
FIG. 1 is a cross-sectional view illustrating a semiconductor device in accordance with an example embodiment of the present inventive concept.

Since the drawings in FIGS. 1-8 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the specific example embodiments set forth herein. Rather, these example embodiments are provided so that this description will be thorough and complete, and will fully convey the scope of the present inventive concept to those skilled in the art.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. Like numerals refer to like elements throughout the specification and the accompany drawings. As used herein, the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", "third", "fourth" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be oriented differently (for example, rotated 90 degrees or at other orientations) and the spatially relative descriptors used herein would then be interpreted accordingly.

In the drawing figures, the dimensions of layers and regions may be exaggerated for clarity of illustration. Like reference numerals refer to like elements throughout. The same reference numbers indicate the same components throughout the specification and the accompanying drawings.

The terminology used herein is for the purpose of describing particular example embodiments of the present inventive concept only and is not intended to be limiting of the present inventive concept. As used herein, the singular forms "a", "an" and "the" are intended to include the plural forms as well, unless the context clearly indicates otherwise. It will be further understood that the terms "comprises" and/or "comprising" when used in this specification, specify the presence of stated features, integers, steps, operations, elements, components, and/or groups, but do not preclude the presence or addition of one or more other features, integers, steps, operations, elements, components, and/or groups thereof.

Example embodiments are described herein with reference to the cross-sectional illustrations that are schematic illustrations of idealized example embodiments (and intermediate structures). As such, variations from the shapes of the illustrations caused from, for example, various manufacturing techniques and/or tolerances, are to be expected. Thus, the example embodiments of the present inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, expressions such as "at least one of" when preceding a list of elements, modify the entire list of elements and do not modify the individual elements of the list.

When the term "about" or "substantially" is used in this specification in connection with a numerical value, it is intended that the associated numerical value includes a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provides support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in the same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made to example embodiments, which are illustrated in the accompanying drawings, wherein like reference numerals may refer to like components throughout the specification and the accompanying drawings.

Figure 2A:
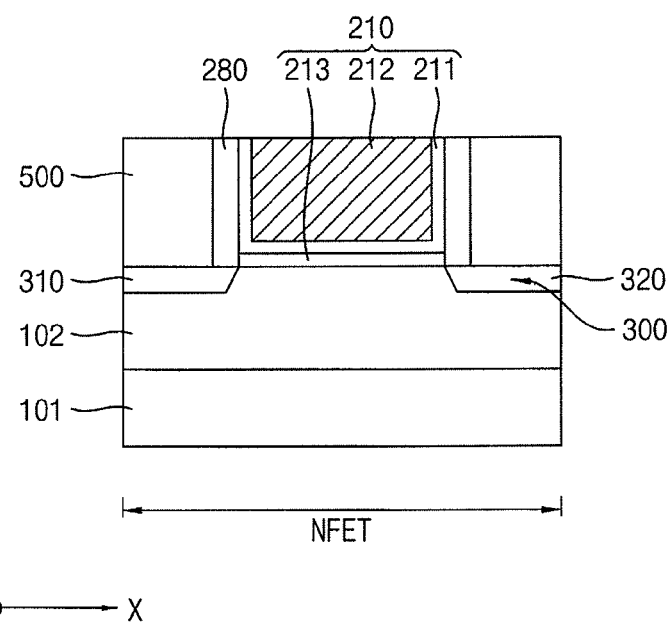
FIG. 2A is a cross sectional view illustrating a first gate structure of the semiconductor device shown in FIG. 1 in accordance with an example embodiment of the present inventive concept.
Figure 2B:
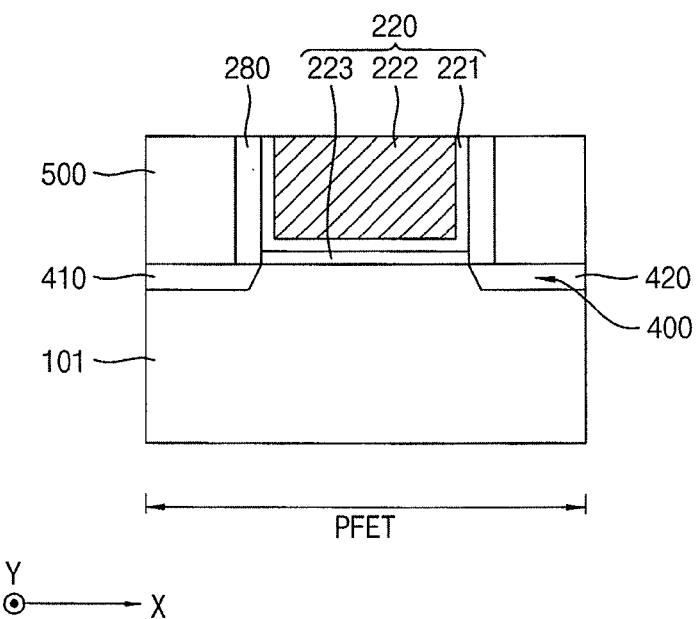
FIG. 2B is a cross sectional view illustrating a second gate structure of the semiconductor device shown in FIG. 1 in accordance with an example embodiment of the present inventive concept.
Figure 2C:
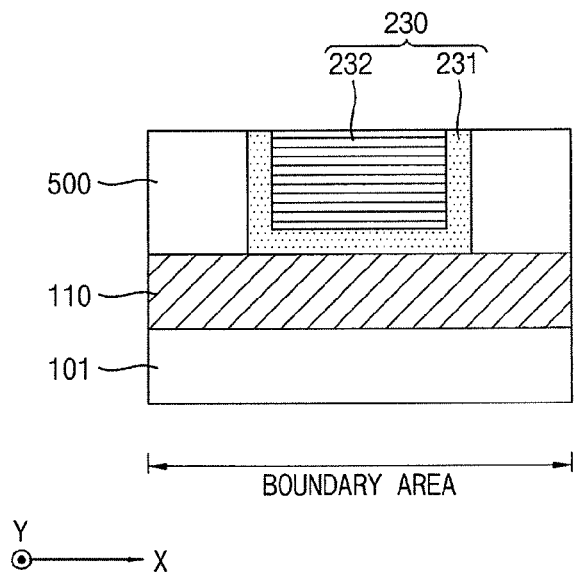
FIG. 2C is a cross sectional view illustrating a third gate structure of the semiconductor device shown in FIG. 1 in accordance with an example embodiment of the present inventive concept.
Figure 2D:
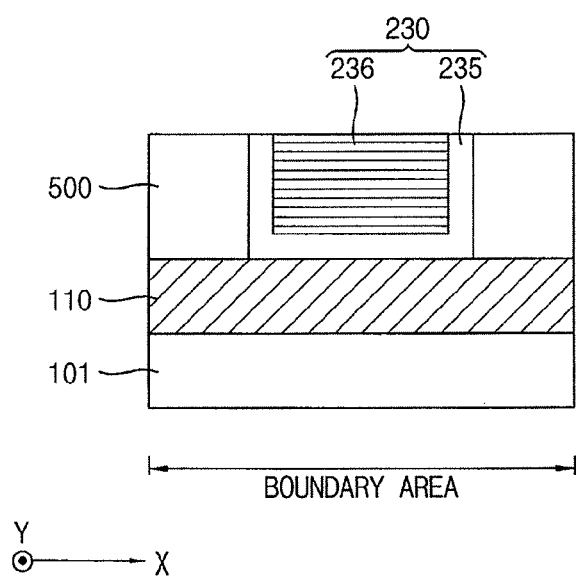
FIG. 2D is a cross sectional view illustrating a third gate structure modified from that of FIG. 2C of the semiconductor device shown in FIG. 1 in accordance with an example embodiment of the present inventive concept.

FIG. 1 is a cross-sectional view illustrating a semiconductor device in accordance with an example embodiment of the present inventive concept. FIG. 2A is a cross sectional view illustrating a first gate structure of the semiconductor device shown in FIG. 1, and FIG. 2B is a cross sectional view illustrating a second gate structure of the semiconductor device shown in FIG. 1. FIG. 2C is a cross sectional view illustrating a third gate structure of the semiconductor device shown in FIG. 1 and FIG. 2D is a cross sectional view illustrating a third gate structure modified from that of FIG. 2C of the semiconductor device shown in FIG. 1. FIG. 1 is a cross sectional view cut along a gate line of the semiconductor device and FIGS. 2A to 2D are cross sectional views cut along an active region of the semiconductor device.

Referring to FIGS. 1 and 2A to 2D, the semiconductor device 1000 in accordance with an example embodiment of the present inventive concept may include a gate line 200 extending along a second direction y, and first and second impurity regions 300 and 400 having different conductivity type. The gate line 200 may be arranged on a substrate 100, and the impurity regions may be arranged at surface positions of the substrate 100 and at side portions of the gate line 200.

The substrate 100 may include a semiconductor substrate such as a silicon (Si) substrate, a gallium (Ga)-arsenic (As) (gallium arsenide) substrate and silicon (Si)-germanium (Ge) substrate, and may include a glass substrate for a flat display panel. In addition, the substrate 100 may include a silicon-on-insulator (SOI) substrate in which a pair of silicon layers may be separated by an insulation layer. The substrate 100 may include any substrates as long as the substrate may include semiconductor characteristics.

The substrate 100 may include an active region A that may be defined by a field region F. A conductive structure such as a gate structure may be arranged on the active region A and an insulation layer such as a device isolation layer 110 may be arranged on the field region F. Thus, the conductive structures on the neighboring active regions A may be electrically isolated from each other by the device isolation layer 110. That is, the device isolation layer 110 in the field region F defines the active region A. For example, the device isolation layer 110 may include silicon oxide that may be formed by a local oxidation of silicon (LOCOS) process or a shallow-trench isolation (STI) process.

The substrate 100 may include a first area N and a second area P of which the conductivity type may be different from each other. For example, the substrate 100 may include a bulk body 101 doped with n-type dopants and a p-type well 102 doped with p-type dopants. Therefore, a p-type field effect transistor (PFET) may be arranged at the active region A of the n-type bulk body 101, and an n-type field effect transistor (NFET) may be arranged at the active region A of the p-type well 102, so a complementary metal-oxide semiconductor (CMOS) device may be arranged on the substrate 100. That is, the NFET may be arranged in the first area N of the substrate 100 and the PFET may be arranged in the second area P of the substrate 100.

The device isolation layer 110 and the active region A may be shaped into a line extending in a first direction x, thus the active regions A and the device isolation layers 110 may be alternately arranged in the second direction y substantially perpendicular to the first direction x. That is, the active region A may be provided as an active line extending in the first direction x and a plurality of the active lines may be spaced apart along the second direction y and defined by the device isolation layer 110.

A boundary area B may be provided between the first and the second areas N and P as a peripheral/core area of the NFET and the PFET. Thus, a signal line for communicating with the NFET and the PFET and a power line for applying an electrical power to the NFET and the PFET may be arranged in the boundary area B of the substrate 100.

The active region A may be provided only in the first and the second areas N and P, so the NFET and the PFET may be arranged only on the active regions A of the first and the second areas N and P, respectively. No active region may be provided in the boundary area B, so the boundary area B may be covered with the device isolation layer 110 extending from the first and the second areas N and P. Since the active region A may be shaped into a line, no active line may be provided in the boundary area B, the first active line may be provided in the first area N, and the second active line may be provided in the second area P. The first and the second active lines are among the plurality of active lines defined by the device isolation layer 110.

The gate line 200 may extend in the second direction y and thus may cross the active line on the substrate 100. For example, an insulation pattern 500 having a linear trench extending along the second direction y may be provided on the substrate 100 and the gate line 200 may be filled in the linear trench.

The gate line 200 may include a plurality of conductive lines that may extend in the second direction y across the active line and may be spaced apart from each other in the first direction x.

The gate line 200 may extend continuously across the first area N, the boundary area B and the second area P. Thus, the gate line 200 may include a first gate structure 210 that may be arranged on the active region A (the first active line) of the first area N, a second gate structure 220 that may be arranged on the active region A (the second active line) of the second area P, and a third gate structure 230 that may be arranged on the device isolation layer 110 at the boundary area B of the substrate 100.

The third gate structure 230 may include materials having conductivity greater than that of the first and the second gate structures 210 and 220, and may also include materials having a dielectric constant smaller than that of the first and the second gate structures 210 and 220. Thus, the parasitic capacitance and the electrical resistance may be sufficiently reduced at the boundary area B, thereby improving electrical characteristics of the gate line 200 and the performance of the semiconductor device 1000.

The first gate structure 210 may include a first dielectric layer 211 including high-k materials and a first metal gate 212 arranging on the first dielectric layer 211 and having a work function for an NMOS. The second gate structure 220 may include a second dielectric layer 221 including high-k materials and a second metal gate 222 arranging on the first dielectric layer 221 and having a work function for a PMOS.

The first and the second dielectric layers 211 and 221 may function as a gate insulation layer of the first and the second gate structures 210 and 220, respectively, and may have a dielectric constant greater than about 10. In an example embodiment of the present inventive concept, the first and the second dielectric layers 211 and 221 may include high-k materials having a dielectric constant in a range of about 15 to about 25. For better gate capacitance, various insulating materials with relatively higher dielectric constant may also be used for the first and the second gate structures 210 and 220, for example, in an example embodiment of the present inventive concept, the first and the second dielectric layers 211 and 221 may include high-k materials having a dielectric constant in a range of about 20 to about 35.

Examples of the high-k materials for the first and the second dielectric layers 211 and 221 may include hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), plumbum scandium tantalum oxide (PbScTaO), etc. These may be used alone or in combinations thereof. The first and the second dielectric layers 211 and 221 may have the same materials or different materials.

The first and the second dielectric layers 211 and 221 may be arranged on a bottom and a sidewall of the linear trench of the insulation pattern 500, so the first and the second dielectric layers 211 and 221 may be shaped into a line extending in the second direction y. Thus, the first and the second dielectric layers 211 and 221 may cover the active region A and the device isolation layer 110.

Preferably, a first interface layer 213 may be further interposed between the substrate 100 and the first dielectric layer 211 and a second interface layer 223 may be further interposed between the substrate 100 and the second dielectric layer 221. When the first and the second dielectric layers 211 and 221 include high-k metal oxide, interfacial defects may be generated between the semiconductor materials of the active region A and the high-k metal oxide. For that reason, a buffer material having low-k materials may be interposed between the high-k metal oxide and the semiconductor material of the active region A for reducing the interfacial defects. The first and the second interface layers 213 and 223 may function as the buffer material between the first and the second dielectric layers 211 and 221 and the active region A, respectively. For example, the first and the second interface layers 213 and 223 may include a low-k material having a dielectric constant less than about 9 such as silicon oxide, silicon oxynitride and silicate. For silicon oxide as the first and the second interface layers 213 and 223, the silicon oxide may be a crystalline oxide or an amorphous oxide, and the first and the second interface layers 213 and 223 may contain just several monolayers of silicon oxide only.

The first and the second metal gates 212 and 222 may include a multilayer having at least one of a metal layer and a metal nitride layer. For example, the first and the second metal gates 212 and 222 may include a barrier metal layer and a conductive metal layer. The barrier metal layer may be arranged on the first and the second dielectric layers 211 and 221, respectively, along a surface profile of the trench of the insulation pattern 500 and may be arranged along the bottom and sidewall of the trench. The conductive metal layer may be arranged to be enclosed by the barrier metal layer and may fill up the trench of the insulation pattern 500.

The barrier metal layer of the first metal gate 212 may provide a better adhesion force between the first metal gate 212 and the first dielectric layer 211 and may prevent metal materials of the conductive metal layer of the first metal gate 212 from being diffused into the first dielectric layer 211. For example, the barrier metal layer of the first metal gate 212 may include at least one of metal nitride, metal oxynitride, metal silicon oxynitride, metal aluminum nitride and combinations thereof.

The work function of the NMOS may be determined by the conductive metal layer of the first metal gate 212. For example, the conductive metal layer of the first metal gate 212 may have a work function of about 3.9 eV to about 4.2 eV and may include at least one of hafnium (Hf), zirconium (Zr), titanium (Ti), tantalum (Ta), aluminum (Al) and alloys or carbides thereof.

In an example embodiment of the present inventive concept, the first metal gate 212 may include the barrier metal layer containing metal nitride and the conductive metal layer containing at least one of titanium aluminide (TiAl), tantalum aluminide (TaAl), titanium aluminum nitride (TiAlN), tantalum aluminum nitride (TaAlN), titanium carbide (TiC), tantalum carbide (TaC), hafnium silicide (HfSi) and combinations thereof.

The barrier metal layer and the conductive metal layer of the first metal gate 212 may include a single layer or a multilayer, and a supplemental layer may be further interposed between the barrier metal layer and the conductive metal layer. In addition, a diffusion layer may be further interposed between the first dielectric layer 211 and the barrier metal layer of the first metal gate 212, thereby controlling the work function of the NFET. Thus, the first metal gate 212 may have various stack structures according to the device requirements. For example, the first metal gate 212 may include a 4-stack structure in which a titanium aluminum layer, a titanium nitride layer, a titanium layer and an aluminum layer may be sequentially stacked in the recess of the insulation pattern 500.

The work function of the PMOS may be determined by the conductive metal layer of the second metal gate 222. For example, the conductive metal layer of the second metal gate 222 may have a work function of about 4.9 eV to about 5.2 eV and may include at least one of ruthenium (Ru), palladium (Pd), platinum (Pt), titanium (Yi), tantalum (Ta), aluminum (Al) and nitrides thereof.

Similar to the first metal gate 212, the barrier metal layer and the conductive metal layer of the second metal gate 222 may include a single layer or a multilayer and a supplemental layer may be further interposed between the barrier metal layer and the conductive metal layer. In addition, a diffusion layer may be further interposed between the second dielectric layer 221 and the barrier metal layer of the second metal gate 222, thereby controlling the work function of the PFET. Thus, the second metal gate 222 may have various stack structures according to the device requirements. For example, the second metal gate 222 may include a 4-stack structure in which a titanium nitride layer, a tantalum nitride layer, a titanium nitride layer and an aluminum layer may be sequentially stacked in the recess of the insulation pattern 500.

The first gate structure 210 may be shaped into a line extending in the second direction y in the first area N, and the second gate structure 220 may be shaped into a line extending in the second direction y in the second area P. The third gate structure 230 may be shaped into a line extending in the second direction y in the boundary area B, and may be connected with the first and the second gate structures 210 and 220. Accordingly, the first, the third and the second gate structures 210, 230 and 220 may be arranged in line with each other along the second direction y, thereby providing the single gate line 200.

The third gate structure 230 may include materials having conductivity greater than that of the first and the second gate structures 210 and 220 and may also include materials having a dielectric constant smaller than that of the first and the second gate structures 210 and 220. For example, the third gate structure 230 may include a third dielectric layer 231 having a dielectric constant smaller than that of the first and the second dielectric layers 211 and 221, and may include a third metal gate 232 enclosed by the third dielectric layer 231 in the recess of the insulation pattern 500.

The third dielectric layer 231 may include a material having a dielectric constant in a range of about 1 to about 5, thereby sufficiently reducing the parasitic capacitance between the third gate structure 230 and the first gate structure 210, and between the third gate structure 230 and the second gate structure 220. For example, the third dielectric layer 231 may include at least one of silicon oxide and porous nano fiber. For silicon oxide as the third dielectric layer 231 to achieve lower dielectric constant, it may be doped with C and/or H, or may be made to form highly porous oxide. Otherwise, an air gap may be provided between the device isolation layer 110 and the third metal gate 232, and between the insulation pattern 500 and the third metal gate 232 in place of the third dielectric layer 231.

The third metal gate 232 may include a single metal layer containing a low resistivity metal. Electrical resistance of the third metal gate 232 may be lower than that of the first and the second metal gates 210 and 220, so an overall electrical resistance of the gate line 200 may be reduced.

Since various wiring structures such as the signal line and the power line may be arranged in the boundary area B without any transistors, the line width of the third gate structure 230 may be larger than that of the first and the second gate structures 210 and 220, even though the device size may be reduced as the integration degree of the semiconductor device increases. Thus, the first and the second gate structures 210 and 220 may not include a low resistivity metal due to an extremely small line width, while the third gate structure 230 may include a low resistivity metal since the line width of the third gate structure 230 may be larger than that of the first and the second gate structures 210 and 220.

The third metal gate 232 may include tungsten (W), titanium (Ti), tantalum (Ta), aluminum (Al) and copper (Cu). In an example embodiment of the present inventive concept, the third metal gate 232 may include a tungsten layer that may be filled into the trench of the insulation pattern 500 in the boundary area B. Tungsten (W) may be substantially difficult to be used as a gate material when the line width of a gate of a cell transistor is less than about 10 nm, even though it has a sufficiently low electrical resistance. However, since the line width of the third gate structure 230 in the boundary area B may not be reduced to less than about 10 nm in spite of the size reduction and the high degree integration of the semiconductor devices 1000, the third gate structure 230 may include tungsten (W), thereby an overall electrical resistance of the gate line 200 may be reduced. As a result, the third gate structure 230 may have a lower electrical resistance than that of the first and the second gate structures 210 and 220, and may have a dielectric constant smaller than that of the first and the second gate structures 210 and 220, thereby sufficiently reducing the parasitic capacitance and the electrical resistance in the boundary area B. Particularly, since the signal line may be arranged in the boundary area B and a common gate signal for the NFET and the PFET may be applied to the signal line, the sufficient reduction of the parasitic capacitance in the boundary area B may provide a better overall alternative current (AC) performance of the semiconductor device 1000.

As illustrated in FIG. 2D, the third gate structure 230 may be modified in such a configuration that the third dielectric layer 231 may be replaced by a barrier metal layer 235, and a single metal layer 236 may be enclosed by the barrier metal layer 235 in the trench of the insulation pattern 500, which may provide a better overall direct current (DC) performance of the semiconductor device 1000.

Since the third gate structure 230 may be connected to a contact structure that may be connected to the signal line, the gate structure 230 and the contact structure may have the same materials, thereby reducing the contact resistance of the third gate structure 230 to the contact structure.

The single metal layer 236 of the third gate structure 230 may include a low resistivity metal, for example, tungsten (W), aluminum (Al) or copper (Cu), and the barrier metal layer 235 of the third gate structure 230 may include a metal nitride, for example, tungsten nitride (WN), titanium nitride (TiN) or tantalum nitride (TaN). In an example embodiment of the present inventive concept, the single metal layer 235 may include tungsten (W) and the barrier metal layer 236 may include tungsten nitride (WN). Accordingly, the third gate structure 230 may reduce the electrical resistance of the gate line 200 and the contact resistance with the contact structure, thereby sufficiently improving the DC performance of the semiconductor device 1000.

A first junction layer 300 doped with n-type impurities may be provided at surface portions of the active region A close to the first gate structure 210 in the first area N of the substrate 100, and a second junction layer 400 doped with p-type impurities may be provided at surface portions of the active region A close to the second gate structure 220 in the second area P of the substrate 100.

The first junction area 300 may be arranged at both side portions of the first gate structure 210, and may include a first source 310 and a first drain 320 that may constitute the NFET together with the first gate structure 210. In the same way, the second junction area 400 may be arranged at both side portions of the second gate structure 220, and may include a second source 410 and a second drain 420 that may constitute the PFET together with the second gate structure 220. Thus, a plurality of the NFETs may be arranged in the first area N of the substrate 100 along the first direction x, and a plurality of the PFETs may be arranged in the second area P of the substrate 100 along the first direction x. A common gate signal may be applied to both of the NFET and the PFET via the signal line in the boundary area B, and the NFET and the PFET may be operated in complementary to each other. Thus, the semiconductor device 1000 may include a complementary metal oxide semiconductor (CMOS) device.

Although not shown in figures, an insulation interlayer covering the insulation pattern 500 and the gate line 200, an interconnection structure penetrating through the insulation interlayer and making contact with the first and the second junction layers 300 and 400, and a wiring structure may be further provided on the insulation pattern 500 and the gate line 200.

Figure 3:
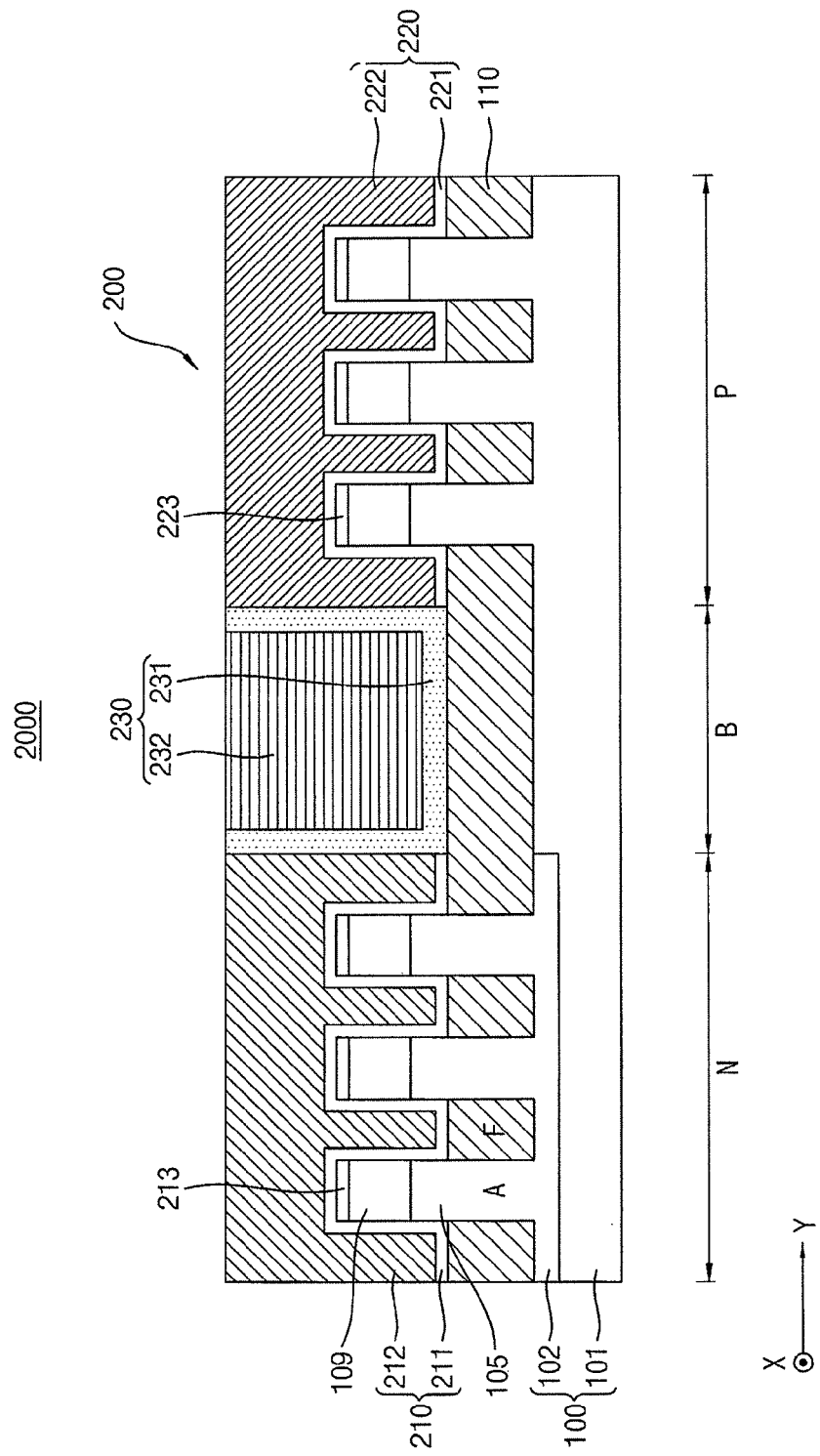
FIG. 3 is a cross-sectional view illustrating a semiconductor device different from that of FIG. 1 in accordance with an example embodiment of the present inventive concept.
Figure 4A:
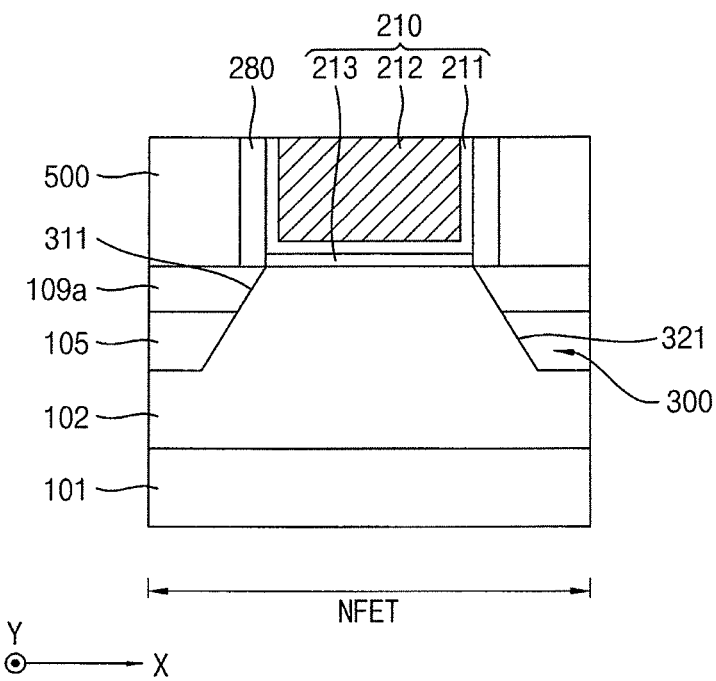
FIG. 4A is a cross sectional view illustrating a first gate structure of the semiconductor device shown in FIG. 3 in accordance with an example embodiment of the present inventive concept.
Figure 4B:
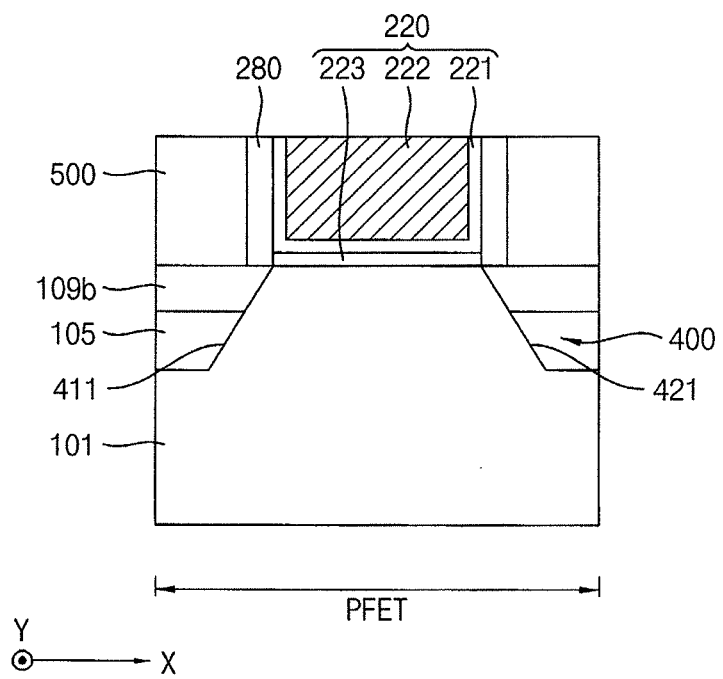
FIG. 4B is a cross sectional view illustrating a second gate structure of the semiconductor device shown in FIG. 3 in accordance with an example embodiment of the present inventive concept.
Figure 4C:
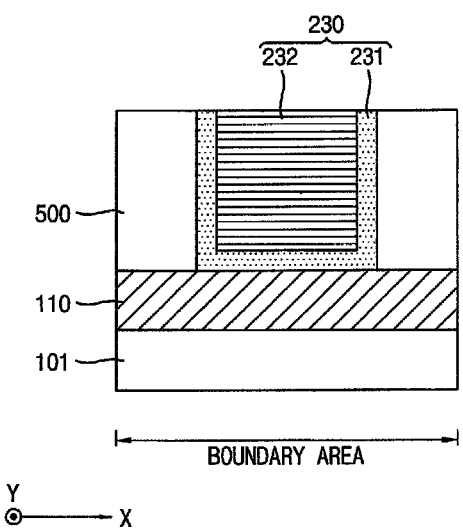
FIG. 4C is a cross sectional view illustrating a third gate structure of the semiconductor device shown in FIG. 3 in accordance with an example embodiment of the present inventive concept.

FIG. 3 is a cross-sectional view illustrating a semiconductor device in accordance with an example embodiment of the present inventive concept. FIG. 4A is a cross sectional view illustrating a first gate structure of the semiconductor device shown in FIG. 3, and FIG. 4B is a cross sectional view illustrating a second gate structure of the semiconductor device shown in FIG. 3. FIG. 4C is a cross sectional view illustrating a third gate structure of the semiconductor device shown in FIG. 3. The semiconductor device 2000 in FIG. 3 may have structures substantially the same as those of the semiconductor device 1000 shown in FIG. 1, except that the NFET and PFET may be arranged on a fin-shaped active region. Thus, the same reference numerals in FIGS. 3 and 4A to 4C denote the same elements in FIGS. 1 and 2A to 2C.

Referring to FIGS. 3 and 4A to 4C, the active region A may protrude from the device isolation layer 110 like a fin, thereby being shaped into an active fin line 105 extending in the first direction x. The gate line 200 may extend in the second direction y and may cross the active fin line A. The gate line 200 may cross a plurality of active fin lines 105 which protrude from the device isolation layer 110 in the first area N and the second area P. The gate line 200 may be over the tops and on the sides of the active fin lines 105.

The first gate structure 210 may be arranged on the first active fin line A in the first area N of the substrate 100, and the first junction layer 300 may be arranged at both sides of the first gate structure 210. Thus, a fin-shaped NFET may be arranged in the first area N of the substrate 100. In the same way, the second gate structure 220 may be arranged on the second active fin line A in the second area P of the substrate 100, and the second junction layer 400 may be arranged at both sides of the second gate structure 220. Thus, a fin-shaped PFET may be arranged in the second area P of the substrate 100. The first and the second active fin lines A are among the plurality of active fin lines 105 protruding from the device isolation layer 110 in the first area N and the second area P. Therefore, the semiconductor device 2000 may include a CMOS device including fin-shaped NFETs and PFETs in which the channel area of the NFET and the PFET may be enlarged to thereby minimize the short channel effect.

No active fin line may be arranged in the boundary area B of the substrate 100, and the boundary area B of the substrate 100 may be covered with the device isolation layer 110. Thus, the device isolation layer 110 may be exposed through the trench of the insulate pattern 500 at the boundary area B, and the third gate structure 230 may fill up the trench of the insulation pattern 500. That is, the third gate structure 230 may include a third dielectric layer 231 having a low dielectric constant and the third gate metal 232.

The third dielectric layer 231 may have a width the same as or different from those of the first and the second dielectric layers 211 and 221. In an example embodiment of the present inventive concept, the third dielectric layer 231 may have a width different from those of the first and the second dielectric layers 211 and 221 fabricated through an additional process.

The first and the second metal gates 212 and 222 may have a multilayer structure that may be formed under process requirements in view of the configurations of a recess between active fin lines 105, such as the shape and the size of the recess. Thus, the first and the second metal gates 212 and 222 may have various modification of the multilayer structure in accordance with the size reduction and the integration degree increase. However, the third metal gate 232 may have a single layer structure, and may fill up the single recess of the insulation pattern 500 at the boundary area B of the substrate 100. In addition, the most significant requirements of the third metal gate 232 may include the electrical connection with the first and the second metal gates 212 and 222. For those reasons discussed above, the third gate structure 230 may be irrelevant to the modifications of the cell structures in the first and the second areas N and P.

In an example embodiment of the present inventive concept, the third gate structure 230 of the semiconductor device 2000 may be substantially the same as or similar to the third gate structure of the semiconductor device 1000 shown in FIG. 1. Thus, the third gate structure 230 may include a stack layer of a dielectric layer having a low dielectric constant and a single metal layer, or a stack layer of a single metal nitride layer and a single metal layer.

The first active fin line at both sides of the gate line 200 in the first area N of the substrate 100 may be doped with n-type impurities and provided as a portion of the first junction layer 300, and the second active fin line at both sides of the gate line 200 in the second area P of the substrate 100 may be doped with p-type impurities and provided as a portion of the second junction layer 400.

A semiconductor pattern 109 may be additionally provided on the active fin line 105 at both sides of the gate line 200, so the first and the second junction layers 300 and 400 may be provided as an elevated structure and arranged on the semiconductor 109. In such a case, the semiconductor pattern 109 may include a first semiconductor pattern 109a that may be arranged in the first area N and may be doped with n-type impurities, and a second semiconductor pattern 109b that may be arranged in the second area P and may be doped with p-type impurities. Therefore, the first junction layer 300 doped with n-type impurities may be provided at surface portions of the first semiconductor pattern 109a in the first area N of the substrate 100, and the second junction layer 400 doped with p-type impurities may be provided at surface portions of the second semiconductor pattern 109b in the second area P of the substrate 100.

The semiconductor pattern 109 may include an epitaxial pattern that may be grown to a height on the active fin line 105 by a selective epitaxial growth (SEG) process. The semiconductor pattern 109 may include semiconductor materials such as silicon germanium (SiGe). Any other pattern may be used for the semiconductor pattern 109 in place of the epitaxial pattern as long as the pattern may include semiconductor characteristics and thus may function as donor electrons or acceptor holes.

The first junction area 300 may include a first elevated source 311 and a first elevated drain 321 that may be arranged at both side portions of the first gate structure 210 and may constitute the NFET together with the first gate structure 210. In the same way, the second junction area 400 may include a second source 411 and a second drain 421 that may be arranged at both side portions of the second gate structure 220 and may constitute the PFET together with the second gate structure 220.

A plurality of the NFETs may be arranged in the first area N of the substrate 100 along the first direction x, and a plurality of the PFETs may be arranged in the second area P of the substrate 100 along the first direction x. A common gate signal may be applied to both of the NFET and the PFET via the signal line in the boundary area B, and the NFET and the PFET may be operated in complementary to each other. Thus, the semiconductor device 1000 may include a complementary metal oxide semiconductor (CMOS) device. Accordingly, the channel region may be sufficiently enlarged in spite of the size reduction of the semiconductor device 2000, thereby reducing current leakage caused by the short channel effect and improving gate response characteristics. In addition, the low electrical resistance and low dielectric constant of the third gate structure 230 in the boundary area B may reduce the parasitic capacitance and the overall electrical resistance of the gate line 200, thereby sufficiently improving the AC and DC performance of the semiconductor device 2000.

Figure 6A:
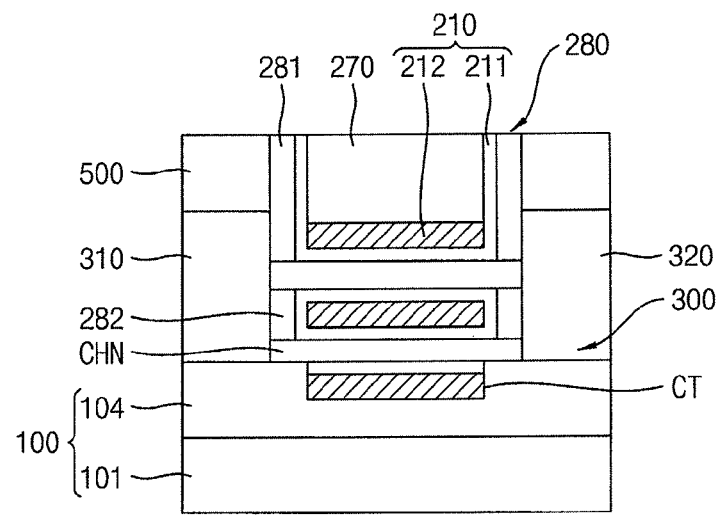
FIG. 6A is a cross sectional view illustrating a first gate structure of the semiconductor device shown in FIG. 5 in accordance with an example embodiment of the present inventive concept.
Figure 6B:
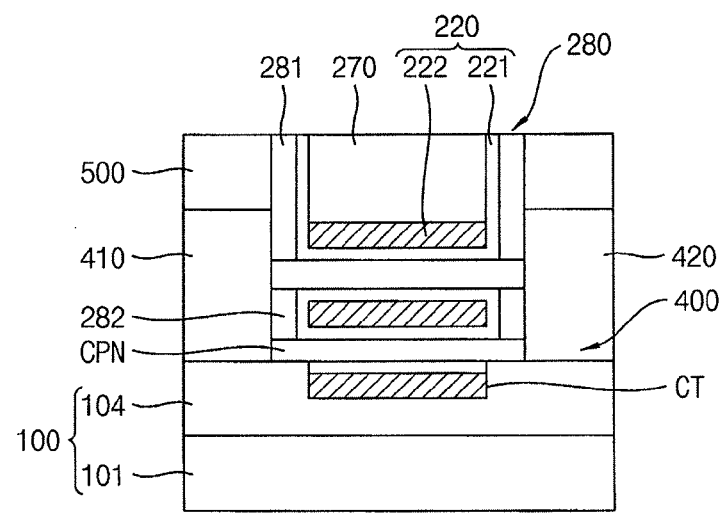
FIG. 6B is a cross sectional view illustrating a second gate structure of the semiconductor device shown in FIG. 5 in accordance with an example embodiment of the present inventive concept.
Figure 6C:
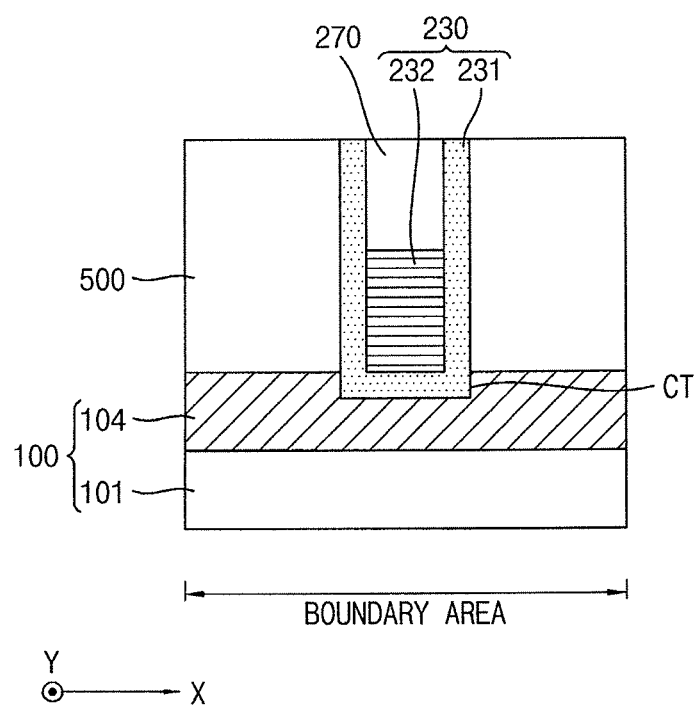
FIG. 6C is a cross sectional view illustrating a third gate structure of the semiconductor device shown in FIG. 5 in accordance with an example embodiment of the present inventive concept.

FIG. 5 is a cross-sectional view illustrating a semiconductor device in accordance with an example embodiment of the present inventive concept. FIG. 6A is a cross sectional view illustrating a first gate structure of the semiconductor device shown in FIG. 5 and FIG. 6B is a cross sectional view illustrating a second gate structure of the semiconductor device shown in FIG. 5. FIG. 6C is a cross sectional view illustrating a third gate structure of the semiconductor device shown in FIG. 5. The semiconductor device 3000 in FIG. 5 may have structures substantially the same as those of the semiconductor device 1000 shown in FIG. 1, except that the gate structures of the NFET and PFET may include a gate-all-around (GAA) structure. Thus, the same reference numerals in FIGS. 5 and 6A to 6C denote the same elements in FIGS. 1 and 2A to 2C.

Referring to FIGS. 5 and 6A to 6C, a channel trench CT may be arranged on the substrate 100 in the second direction y and the gate line 200 may be buried in the channel trench CT. The first and the second junction layers 300 and 400 may be arranged on the active region A around the channel trench CT.

The substrate 100 may include a silicon-on-insulator (SOI) substrate in which a pair of upper and lower silicon layers may be separated by a board insulation layer 104. The lower silicon layer may be provided as a bulk body 101 and the upper silicon layer may be transformed into channel structures CHN and CHP.

The upper silicon layer may be patterned into a line extending in the first direction x, thereby forming an active fin line on the board insulation layer 104. A plurality of the active fin lines may extend in the first direction x and may be spaced apart from each other in the second direction y. Thus, the board insulation layer 104 may function as a device isolation layer that may define and separate a plurality of the active fin lines. In an example embodiment of the present inventive concept, a semiconductor pattern such as an epitaxial layer may be further provided on the active fin line.

The upper silicon layer may include an n-type layer which may be doped with n-type impurities, and the board insulation layer 104 may include a silicon oxide layer. The upper silicon layer may be divided into a first area N having a p-well which may be locally doped with p-type impurities, a second area P having no well, and a boundary area B interposed between the first and the second areas N and P. The board insulation layer 104 and the bulk body 101 under the upper silicon layer may also be divided into the same first and second areas N and P and the boundary area B in accordance with the upper silicon layer. A first channel structure CHN for an NFET may be formed in the first area N of the substrate 100, and a second channel structure CHP for a PFET may be formed in the second area P of the substrate 100.

The linear trench of the insulation pattern 500 may be vertically extended into a trench that may be recessed to a predetermined depth into the board insulation layer 104. Hereinafter, the liner trench of the insulation pattern 500 and the trench of the board insulation layer 104 that may be communicated with the linear trench may be referred to as a channel trench CT. Thus, the channel trench CT may also be shaped into a line extending in the second direction y, and the active fin line may be broken or separated by the channel trench CT along the first direction x. The gate line 200 may fill up a lower portion of the channel trench CT, thus an upper surface of the gate line 200 may be lower than a top surface of the board insulation layer 104. That is, the gate line 200 may be provided as a buried line in the board insulation layer 104.

A pair of the active fin lines that may be separated by the channel trench CT may be connected to each other by the first and the second channel structures CHN and CHP extending in the first direction x. Thus, portions of the active fin line that may be contact with the CHN and CHP may be provided as source and drain regions, and the first and the second channel structures CHN and CHP may function as an electron path penetrating through the channel trench CT between the source and drain regions.

The gate line 200 may make contact with the surfaces of the first and the second channel structures CHN and CHP in the lower portion of the channel trench CT, so the electron transfer between the source region and the drain region may be selectively controlled by a gate signal that may be applied to the gate line 200.

The first and the second channel structures CHN and CHP may have various configurations in accordance with process requirements and device requirements. For example, each of the first and the second channel structures CHN and CHP may include a lower component channel on the board insulation layer 104 and an upper component channel over the lower component channel in the channel trench CT. The number of the component channels may be varied in accordance with the size of the epitaxial layer on the active fin line. In an example embodiment of the present inventive concept, the gate line 200 may include the GAA structure, so each of the lower and upper component channels may be enclosed by the gate line 200, thereby enlarging the channel area in the channel trench CT. Particularly, each of the first and the second channel structures CHN and CHP may be provided as a nano wire channel, thereby reducing the size of the semiconductor device 3000 and improving the transfer efficiency in the channel.

A channel spacer 280 may be arranged along a sidewall of the channel trench CT, thus the gate line 200 in the channel trench CT and the active fin line may be electrically separated by the channel spacer 280. In an example embodiment of the present inventive concept, the channel spacer 280 may include a first spacer 281 extending downwards to an upper surface of the upper component channel from a top portion of the channel trench CT, and a second spacer 282 interposed between the lower component channel and the upper component channel.

The gate line 200 may include a first gate structure 210 crossing the active fin line in the first area N, a second gate structure 220 crossing the active fin line in the second area P, and a third gate structure 230 interposed between the first and the second gate structures 210 and 220 and arranged on the board insulation layer 104 in the boundary area B.

The first gate structure 210 may include a first dielectric layer 211 covering the surface of the first channel structure CHN and a side surface of the channel spacer 280, and a first metal gate 212 filling up the lower portion of the channel trench CT that may be defined by the channel spacer 280. Thus, the first channel structure CHN may be sequentially enclosed by the first dielectric layer 211 and the first metal gate 212 in the channel trench CT. The first metal gate 212 may have a work function for the NFET. The second gate structure 220 may include a second dielectric layer 221 covering the surface of the second channel structure CHP and a side surface of the channel spacer 280, and a second metal gate 222 filling up the lower portion of the channel trench CT that may be defined by the channel spacer 280. Thus, the second channel structure CHP may be sequentially enclosed by the second dielectric layer 221 and the second metal gate 222 in the channel trench CT. The second metal gate 222 may have a work function for the PFET. The third gate structure 230 may include a third dielectric layer 231 covering the sidewalls and the bottom of the channel trench CT in the boundary area B and having a low dielectric constant, and a third metal gate 232 may fill up the lower portion of the channel trench CT in the boundary area B.

The compositions of the first to third gate structures 210 to 230 may be substantially the same as those of the first to third gate structures of the semiconductor device shown in FIG. 1, so that any further detailed descriptions on the first to third gate structures 210 to 230 will be omitted. Particularly, the third gate structure 230 may also be modified to have structures the same as those of the third gate structure 230 described in detail with reference to FIG. 2D in which the third gate structure 230 may include a stack structure of a barrier metal layer including metal nitride and a single metal layer enclosed by the barrier metal layer.

An upper portion of the channel trench CT may be filled up with a capping layer 270, thus the gate line 200 may be sealed from surroundings by the capping layer 270. The capping layer 270 may cover the gate line 200 and may have a flat upper surface that may be coplanar with upper surfaces of the channel spacer 280 and the insulation pattern 500.

The first and the second junction layers 300 and 400 may be arranged on the active fin line around or neighboring the channel trench CT. The first and the second channel structures CHN and CHP may cross the channel trench CT to contact with the first and the second junction layers 300 and 400, respectively. The first junction layer 300 may be doped with n-type impurities and may include the first source 310 and the first drain 320. In the same way, the second junction layer 400 may be doped with p-type impurities and may include the second source 410 and the second drain 420. Particularly, when an epitaxial layer may be further provided on the active fin line, the first and the second junction layers 300 and 400 may have an elevated structure in which the first and the second channel structures CHN and CHP may be under the first and the second junction layers 300 and 400, respectively. In such a case, the first and second junction layers 300 and 400 may include elevated source/drain (ESD) structures.

The first source 310 and the first drain 320 may be arranged at both side portions of the first gate structure 210, and may constitute the NFET together with the first gate structure 210. In the same way, the second source 410 and the second drain 420 may be arranged at both side portions of the second gate structure 220, and may constitute the PFET together with the second gate structure 220. Accordingly, the semiconductor device 3000 may include a buried-channel array CMOS device having a nano wire channel. In such a case, the low electrical resistance and the low dielectric constant of the third gate structure 230 in the boundary area B may reduce the parasitic capacitance and the overall electrical resistance of the gate line 200, thereby sufficiently improving the AC and DC performance of the semiconductor device 3000.

Figure 7:
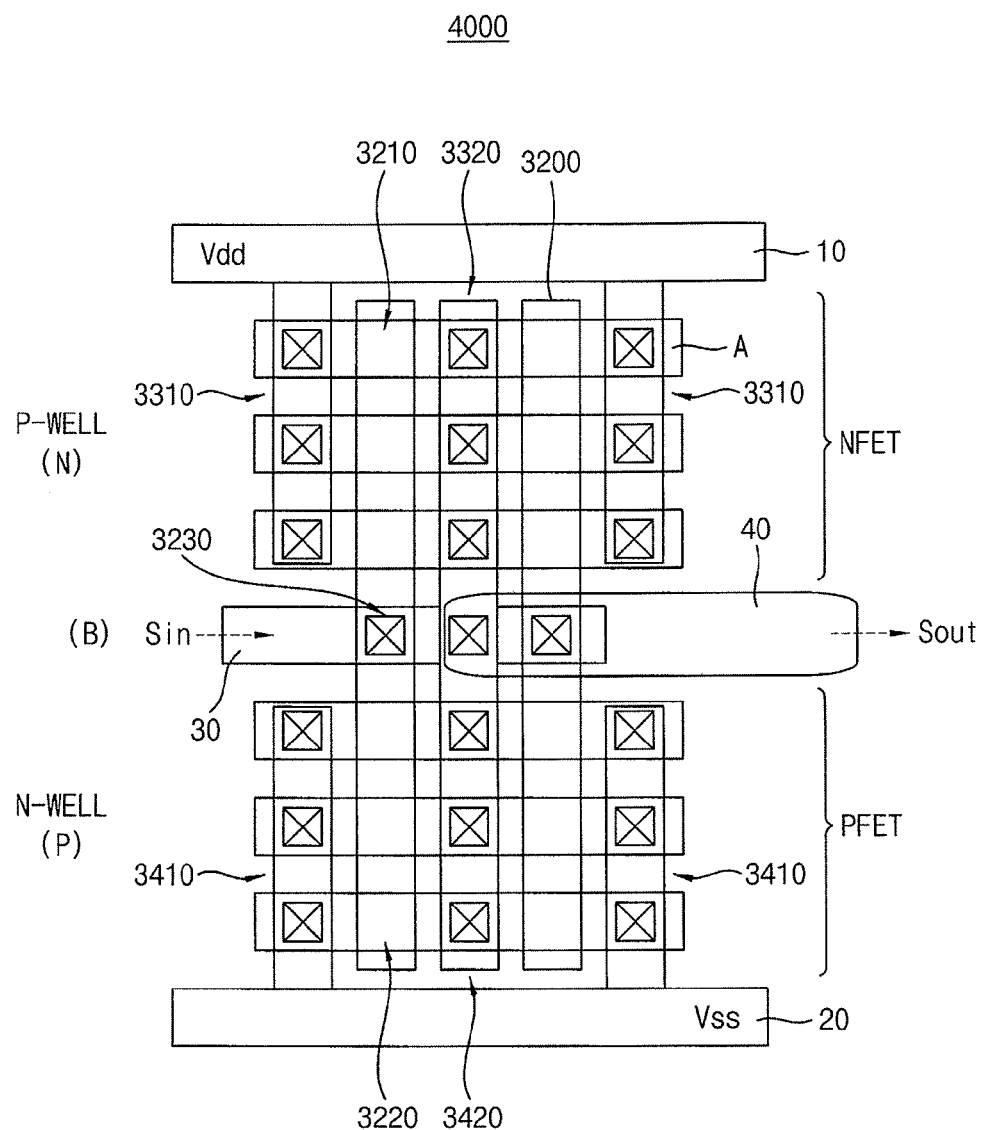
FIG. 7 is a layout illustrating a CMOS inverter including at least one of the semiconductor devices shown in FIGS. 1 to 6C in accordance with an example embodiment of the present inventive concept.

FIG. 7 is a layout illustrating a CMOS inverter including at least one of the semiconductor devices shown in FIGS. 1 to 6C and FIG. 8 is a circuit diagram of the CMOS inverter shown in FIG. 7.

Figure 8:
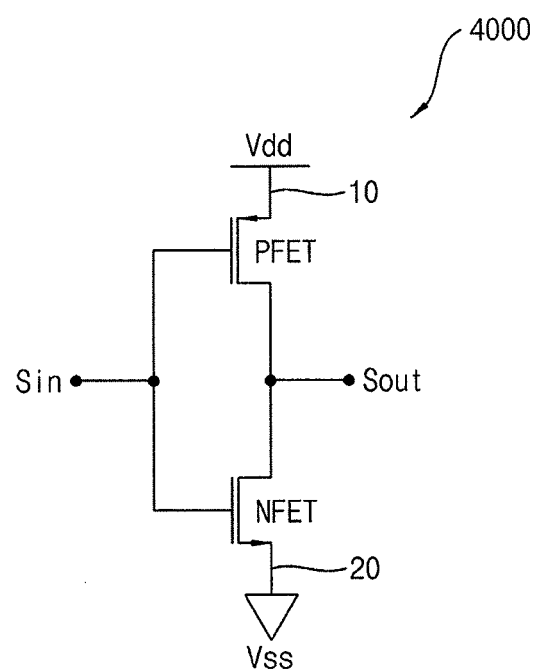
FIG. 8 is a circuit diagram of the CMOS inverter shown in FIG. 7 in accordance with an example embodiment of the present inventive concept.

Referring to FIGS. 7 and 8, the CMOS inverter 4000 in accordance with an example embodiment of the present inventive concept may include at least an n-type transistor NFET interconnected with a first signal line 10 to which a first signal Vdd may be applied and an output line 40 from which an output signal Sout may be transferred, and at least a p-type transistor PFET interconnected with a second signal line 20 to which a second signal Vss may be applied and the output line 40. An input line 30 for transferring an input signal Sin may be commonly connected to gate electrodes of the n-type transistor NFET and the p-type transistor PFET.

A source electrode 3310 of the n-type transistor NFET may be connected to the first signal line 10 via a contact plug, and a source electrode 3410 of the p-type transistor PFET may be connected to the second signal line 20 via a contact plug. A drain electrode 3320 of the n-type transistor NFET and a drain electrode 3420 of the p-type transistor PFET may be commonly connected to the output line 40 via a contact plug. Thus, the output line 40 may selectively transfer the output signal Sout from the n-type transistor NFET or the p-type transistor PFET in response to the input signal Sin. Accordingly, the n-type transistor NFET and the p-type transistor PFET may be operated in complementary to each other.

An n-type bulk substrate doped with n-type dopants may be provided as a substrate for the CMOS inverter 4000 and may be divided into a first area N in which a p-well locally doped with p-type dopants, a second area P having no p-well and a boundary area B interposed between the first and the second areas N and P. A gate line 3200 may extend on the substrate across the first area N, the second area P and the boundary area B. A first gate electrode of the n-type transistor NFET may be arranged on the p-well and may constitute the gate line 3200 in the first area N. A second gate electrode of the p-type transistor PFET may be arranged on the bulk substrate and may constitute the gate line 3200 in the second area P. The input line 30 may be connected to the gate line 3200 in the boundary area B.

The gate line 3200 may include a first gate structure 3210 that may be arranged at an active region A of the first area N of the substrate and functioning as the first gate electrode of the n-type transistor NFET, a second gate structure 3220 that may be arranged at an active region A of the second area P of the substrate and functioning as the second gate electrode of the p-type transistor PFET, and a third gate structure 3230 that may be arranged in the boundary area B of the substrate and may be connected to the first and the second gate structures 3210 and 3220 while being connected to the input line 30 via the contact plug. In such a case, the dielectric constant and the electrical resistance of the third gate structure 3230 may be smaller than those of the first and the second gate structures 3210 and 3220.

The first gate structure 3210 may include a first dielectric layer having a relatively high dielectric constant and including high-k materials, and a first metal gate that may be arranged on the first dielectric layer and may have a first work function for an NMOS. The second gate structure 3220 may include a second dielectric layer having a relatively high dielectric constant and including high-k materials, and a second metal gate that may be arranged on the second dielectric layer and may have a second work function for a PMOS. The third gate structure 3230 may include a third dielectric layer having a relatively low dielectric constant and including low-k materials, and a third metal gate that may be arranged on the third dielectric layer and may include a single metal. The third dielectric layer may include a silicon oxide layer and a metal nitride layer. Otherwise, an air gap may be provided in place of the third dielectric layer.

The first to third gate structures 3210 to 3230 of the gate line 3200 may have structures substantially the same as those of the first to third gate structures 210 to 230 described in detail with reference to FIGS. 2A to 2D, 4A to 4C and 6A to 6C. Thus, any detailed descriptions on the first to third gate structures 3210 to 3230 of the gate line 3200 will be omitted. Accordingly, the dielectric constant and the electrical resistance of the third gate structure 3230 may be sufficiently smaller than those of the first and the second gate structures 3210 and 3220, thereby reducing the parasitic capacitance of the gate line 3200 and simultaneously reducing the electrical resistance and the contact resistance of the third gate structure 3230. Therefore, the AC and DC performance of the CMOS inverter 4000 may become sufficiently better.

According to the example embodiments of the semiconductor devices, a single gate line may extend on a substrate in a line across an NMOS area, a PMOS area and a boundary area interposed between the NMOS and the PMOS areas. An NMOS gate structure may be provided with the gate line in the NMOS area of the substrate and a PMOS gate structure may be provided with the gate line in the PMOS area of the substrate. A boundary gate structure may be provided with the gate line in the boundary area of the substrate in such a way that the boundary gate structure may be electrically connected with both of the NMOS and PMOS gate structures. In such a case, the dielectric constant and the electrical resistance of the boundary gate structure may be sufficiently smaller than those of the NMOS and the PMOS gate structures, thereby reducing the parasitic capacitance and an overall electrical resistance of the gate line. In addition, in case of the CMOS inverter including the semiconductor devices, the contact resistance between the boundary gate structure and the contact plug may also be reduced, thereby improving the operation performance of the CMOS inverter. Particularly, the parasitic capacitance reduction of the gate line between the NMOS area and the PMOS area may sufficiently increase the AC performance of the CMOS inverter.

The foregoing is illustrative of example embodiments of the present inventive concept and is not to be construed as limiting thereof. Although a few example embodiments have been described, those skilled in the art will readily appreciate that many modifications are possible in the example embodiments without materially departing from the novel teachings of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
   a substrate divided into first and second areas and having a plurality of active lines that extends in a first direction, the plurality of active lines being defined by a device isolation layer, and
   a gate line extending in a second direction across the plurality of active lines, the gate line including a first gate structure on a first active line in the first area of the substrate, a second gate structure on a second active line in the second area of the substrate, and a third gate structure on the device isolation layer in a third area of the substrate that is interposed between the first and the second areas and has no active lines,
   wherein a composition of the third gate structure is different from those of the first and the second gate structures, and
   wherein the first gate structure comprises a first dielectric layer and a first metal gate on the first dielectric layer;
   the second gate structure comprises a second dielectric layer and a second metal gate on the second dielectric layer; and
   the third gate structure comprises a barrier metal layer and a third metal gate on the barrier metal layer.

2. The semiconductor device of claim 1, wherein a composition of the third metal gate is different from those of the first and the second metal gates.

3. The semiconductor device of claim 2, wherein the first metal gate has a composition the same as that of the second metal gate.

4. The semiconductor device of claim 1, wherein the third metal gate has a layer structure different from those of the first and the second metal gates.

5. The semiconductor device of claim 1, wherein the third gate structure directly contacts with the first gate structure and the second gate structure in the second direction.

6. The semiconductor device of claim 1, wherein the first and the second areas of the substrate have different conductivity type.

7. A semiconductor device comprising:
a substrate divided into first and second areas and having a plurality of active lines that extend in a first direction, the plurality of active lines being defined by a device isolation layer; and
a gate line extending in a second direction across the plurality of active lines, the gate line including a first gate structure on a first active line in the first area of the substrate, a second gate structure on a second active line in the second area of the substrate, and a third gate structure on the device isolation layer in a third area of the substrate that is interposed between the first and the second areas and has no active lines,
wherein the third gate structure directly contacts with the first gate structure and the second gate structure, and
wherein the first gate structure comprises a first dielectric layer and a first metal gate on the first dielectric layer;
the second gate structure comprises a second dielectric layer and a second metal gate on the second dielectric layer; and
the third gate structure comprises a barrier metal layer and a third metal gate on the barrier metal layer.

8. The semiconductor device of claim 7, wherein a composition of the third metal gate is different from those of the first and the second metal gates.

9. The semiconductor device of claim 8, wherein the first metal gate has a composition the same as that of the second metal gate.

10. The semiconductor device of claim 7, wherein sidewalls of the third gate structure directly contact with sidewalls of the first and the second gate structures, respectively, in the second direction and a bottom surface of the third gate structure makes no contact with the first and the second gate structures.

11. A semiconductor device comprising:
a substrate divided into first and second areas and having a plurality of active fin lines that extend in a first direction, the plurality of active fin lines being defined by a device isolation layer, and
a gate line extending in a second direction across the plurality of active fin lines, the gate line including a first gate structure on a first active fin line in the first area of the substrate, a second gate structure on a second active fin line in the second area of the substrate, and a third gate structure on the device isolation layer in a third area of the substrate that is interposed between the first and the second areas and has no active fin lines,
wherein a composition of the third gate structure is different from those of the first and the second gate structures, and
wherein the first gate structure comprises a first dielectric layer and a first metal gate on the first dielectric layer;
the second gate structure comprises a second dielectric layer and a second metal gate on the second dielectric layer; and
the third gate structure comprises a barrier metal layer and a third metal gate on the barrier metal layer.

12. The semiconductor device of claim 11, wherein a composition of the third metal gate is different from those of the first and the second metal gates.

13. The semiconductor device of claim 12, wherein the first metal gate has a composition the same as that of the second metal gate.

14. The semiconductor device of claim 11, wherein the third metal gate has a layer structure different from those of the first and the second metal gates.

15. The semiconductor device of claim 11, wherein the third gate structure directly contacts with the first gate structure and the second gate structure in the second direction.

16. The semiconductor device of claim 11, wherein the first and the second areas of the substrate have different conductivity type.

* * * * *